(12) United States Patent
Song et al.

(10) Patent No.: US 10,811,629 B2
(45) Date of Patent: Oct. 20, 2020

(54) DISPLAY PANEL AND MANUFACTURING METHOD THEREOF

(71) Applicant: Samsung Display Co., Ltd., Yongin-si, Gyeonggi-do (KR)

(72) Inventors: Sunghoon Song, Yongin-si (KR); Taejong Eom, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/137,322

(22) Filed: Sep. 20, 2018

(65) Prior Publication Data

US 2019/0245158 A1 Aug. 8, 2019

(30) Foreign Application Priority Data

Feb. 7, 2018 (KR) .................. 10-2018-0015182

(51) Int. Cl.
*H01L 51/00* (2006.01)
*H01L 51/52* (2006.01)
*H01L 27/32* (2006.01)

(52) U.S. Cl.
CPC ...... *H01L 51/5246* (2013.01); *H01L 51/0096* (2013.01); *H01L 27/3244* (2013.01); *H01L 2227/323* (2013.01); *H01L 2251/566* (2013.01)

(58) Field of Classification Search
CPC ............. G02F 1/133351; G02F 1/1339; G02F 1/1341; H01L 27/3223; H01L 51/56; H01L 27/3246; H01L 2227/323
See application file for complete search history.

(56) References Cited

U.S. PATENT DOCUMENTS

| 6,496,240 | B1 * | 12/2002 | Zhang | G02F 1/133 349/116 |
| 7,271,904 | B2 * | 9/2007 | Jung | G02F 1/1339 118/410 |
| 7,595,857 | B2 * | 9/2009 | Yang | G02F 1/1341 349/153 |
| 8,755,018 | B2 * | 6/2014 | Huang | G02F 1/1339 349/155 |
| 2001/0012089 | A1 * | 8/2001 | Shiraishi | C03B 33/09 349/153 |

(Continued)

FOREIGN PATENT DOCUMENTS

| KR | 10-1146457 B1 | 5/2012 |
| KR | 10-2013-0000656 A | 1/2013 |
| KR | 10-2016-0011298 A | 2/2016 |

OTHER PUBLICATIONS iPhoneX—Technical Specifications—Apple, Apr. 3, 2018, https://www.apple.com/iphone-x/specs/, 12 pages.

*Primary Examiner* — Jaehwan Oh
(74) *Attorney, Agent, or Firm* — Lewis Roca Rothgerber Christie LLP

(57) ABSTRACT

A display panel and a method of manufacturing a display panel are provided. A method of manufacturing a display panel includes: preparing a unit panel including a panel area having a display unit and a margin area arranged outside the panel area and including one or more dummy seals; cutting a line between the panel area and the margin area by irradiating a laser along a boundary of the panel area; and striking a vicinity of the one or more dummy seals such that the margin area at an outer periphery of the cut line is separated from the panel area.

3 Claims, 7 Drawing Sheets

(56) References Cited

U.S. PATENT DOCUMENTS

| | | | |
|---|---|---|---|
| 2003/0123016 A1* | 7/2003 | Kim | G02F 1/1339 349/153 |
| 2003/0169392 A1* | 9/2003 | Park | G02F 1/1339 349/153 |
| 2005/0253994 A1* | 11/2005 | Kamijima | G02F 1/133351 349/155 |
| 2008/0002137 A1* | 1/2008 | Kim | G02F 1/1341 349/187 |
| 2011/0234967 A1* | 9/2011 | Kim | G02F 1/133351 349/155 |
| 2011/0291529 A1* | 12/2011 | Numata | C03B 33/093 310/348 |
| 2014/0060725 A1* | 3/2014 | Ise | G02F 1/1306 156/145 |
| 2015/0327361 A1* | 11/2015 | Wang | G02F 1/133351 174/250 |
| 2016/0018682 A1* | 1/2016 | Kim | G02F 1/133351 349/58 |
| 2016/0129527 A1 | 5/2016 | Moon et al. | |

* cited by examiner

DISPLAY PANEL AND MANUFACTURING METHOD THEREOF

CROSS-REFERENCE TO RELATED APPLICATION

This application claims priority to and the benefit of Korean Patent Application No. 10-2018-0015182, filed on Feb. 7, 2018 in the Korean Intellectual Property Office, the entire disclosure of which is incorporated herein by reference.

BACKGROUND

1. Field

Aspects of embodiments relate to a display panel and a manufacturing method thereof.

2. Description of the Related Art

In general, a display panel has a display unit formed on a base substrate for image formation, and has a structure in which the display unit is covered and protected by an encapsulation substrate. In addition, a gap between the base substrate and the encapsulation substrate is sealed with a sealing member. In manufacturing the display panel, a unit panel having a sufficient non-display clearance space on an outer side of the display unit is prepared, and then cut into a desired size and shape of the display panel.

SUMMARY

According to aspects of one or more embodiments, an improved display panel and a manufacturing method thereof to reduce the possibility of defects in the process of cutting a unit panel into a desired display panel shape are provided.

Additional aspects will be set forth, in part, in the description which follows and, in part, will be apparent from the description, or may be learned by practice of the presented example embodiments.

According to one or more embodiments, a method of manufacturing a display panel includes: preparing a unit panel including a panel area having a display unit and a margin area arranged outside the panel area and including one or more dummy seals; cutting a line between the panel area and the margin area by irradiating a laser along a boundary of the panel area; and striking a vicinity of the one or more dummy seals such that the margin area at an outer periphery of the cut line is separated from the panel area.

The unit panel may be provided with a recessed zone in which a boundary between the panel area and the margin area is recessed toward the display unit, and the one or more dummy seals may be in the recessed zone.

The unit panel may include a base substrate, the display unit provided on the base substrate, an encapsulation substrate covering the display unit, a sealing member surrounding the display unit and filling a gap between the base substrate and the encapsulation substrate, and an inner side of an area surrounded by the sealing member is the panel area, and an outer side of the area is the margin area.

The one or more dummy seals may include a main dummy seal closest to a position that is struck and auxiliary dummy seals spaced apart from the main dummy seal.

The auxiliary dummy seals may include inner auxiliary dummy seals arranged between the main dummy seal and the panel area, and outer auxiliary dummy seals arranged at an outer periphery of the main dummy seal.

All of the main dummy seal, the inner auxiliary dummy seals, and the outer auxiliary dummy seals may have a slim bar shape.

The inner auxiliary dummy seals and the outer auxiliary dummy seals may have a slim bar shape, and the main dummy seal may have a box shape.

The main dummy seal and the outer auxiliary dummy seals may have a slim bar shape, and the inner auxiliary dummy seals may have a U-shape surrounding the main dummy seal.

The outer auxiliary dummy seals may have a slim bar shape, the main dummy seal may have a box shape, and the inner auxiliary dummy seals may have a U-shape surrounding the main dummy seal.

The main dummy seal, the inner auxiliary dummy seals, and the outer auxiliary dummy seals may be arranged at equal intervals.

A trench line, which is a display line to be cut by the laser, may be formed at a boundary of the panel area.

The trench line may be formed on each of the base substrate and the encapsulation substrate.

The striking may be applied directly on the encapsulation substrate.

The method may further include polishing a cut surface of the panel area after separating the margin area.

The unit panel may include only one display unit.

According to one or more embodiments, a display panel includes: a base substrate, a display unit provided on the base substrate, an encapsulation substrate covering the display unit, a sealing member surrounding the display unit and filling a gap between the base substrate and the encapsulation substrate, and chipping areas which have a jagged cross-section having a length of 200 µm or less from an end portion of each of the base substrate and the encapsulation substrate.

The display panel may further include a recessed zone in which a portion of an outline is recessed toward the display unit.

A length difference of the chipping areas of the base substrate and the encapsulation substrate may be 10 µm or less.

The chipping area may be on a surface of the base substrate on which the display unit is provided and a surface opposite a surface of the encapsulation substrate facing the display unit, respectively.

The display unit may include a thin-film transistor and an organic light-emitting device.

BRIEF DESCRIPTION OF THE DRAWINGS

These and/or other aspects will become apparent and more readily appreciated from the following description of some example embodiments, taken in conjunction with the accompanying drawings in which.

DETAILED DESCRIPTION

Figure 1:
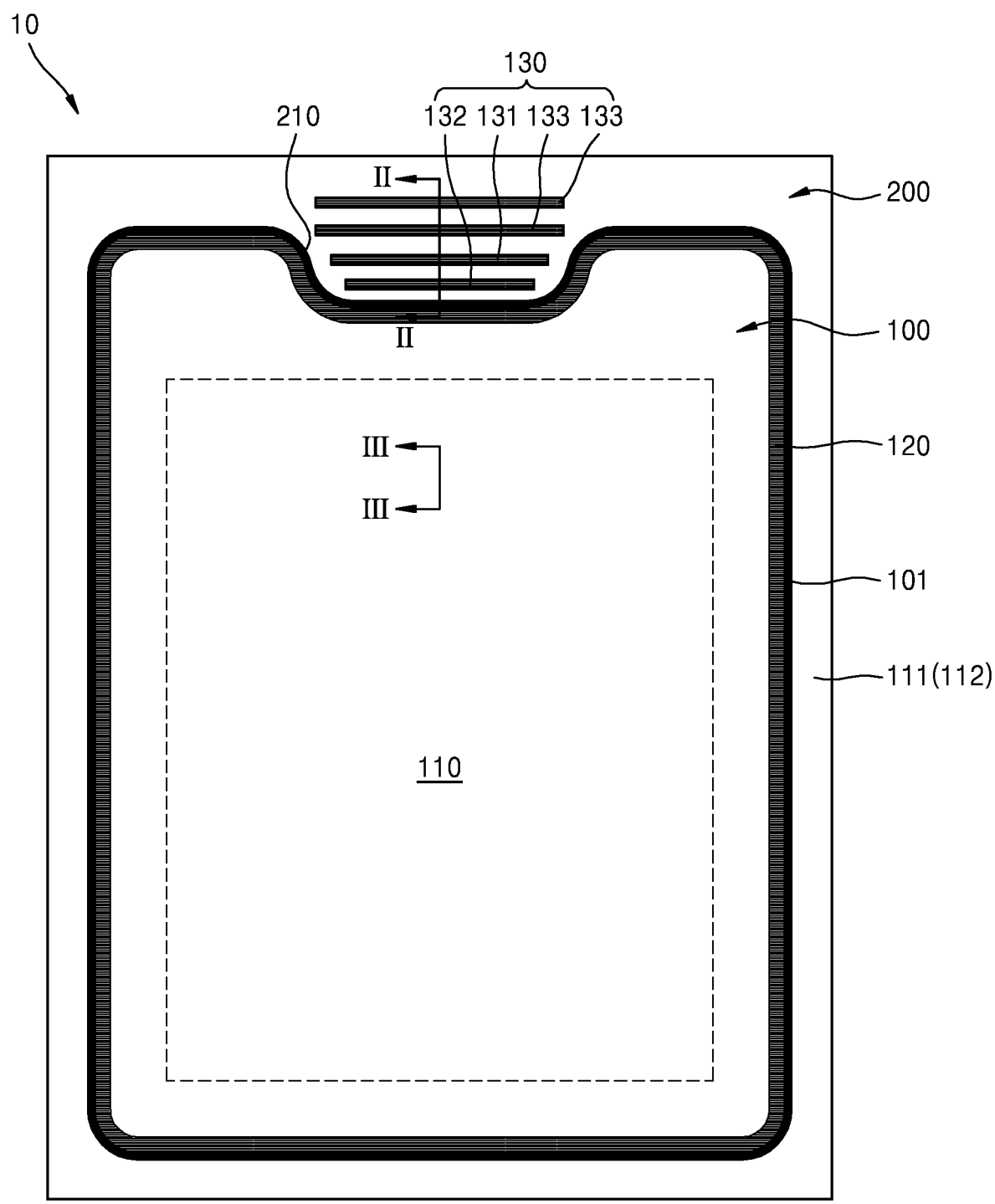
FIG. 1 is a plan view of a unit panel in which a panel area and a margin area are cut according to a manufacturing method of the present disclosure.

Reference will now be made in further detail to some example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description.

An expression used in the singular encompasses the expression of the plural, unless it has a clearly different meaning in the context.

It is to be further understood that the terms "comprises" and/or "comprising" used herein specify the presence of stated features or components, but do not preclude the presence or addition of one or more other features or components.

Sizes of components in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

FIG. 1 is a plan view of a unit panel 10 including a margin area 200 before cutting a panel area 100 into a desired shape and making the panel area 100 into a display panel.

As shown in FIG. 1, the unit panel 10 includes the panel area 100 having a display unit 110 and the margin area 200 surrounding the panel area 100. In an embodiment, at a boundary between the panel area 100 and the margin area 200, a trench 101 having a concave shape is formed as a display line for cutting. In an embodiment, the trench 101 is formed in the same manner in an encapsulation substrate 112 and a base substrate 111, which are upper and lower substrates of the unit panel 10, and the center panel area 100 becomes a display panel, and the margin area 200 is removed.

A sealing member 120 surrounding the display unit 110 is provided between the base substrate 111 and the encapsulation substrate 112 to fill a gap between the base substrate 111 and the encapsulation substrate 112. In an embodiment, the unit panel 10 is provided with only one display unit 110 that implements a screen.

In an embodiment, referring to a shape of the trench 101, which is the boundary between the panel area 100 and the margin area 200, there is formed a recessed zone 210 which is recessed toward the display unit 110 at an upper end of the unit panel 10, as illustrated in FIG. 1, and a plurality of dummy seals 130, which are isolated like an island, are arranged within the recessed zone 210. The dummy seals 130 are also formed between the base substrate 111 and the encapsulation substrate 112 like the sealing member 120. In an embodiment, the dummy seals 130 are arranged on a plane as shown in FIG. 1 in the recessed zone 210.

The dummy seals 130 are prepared for a striking process. That is, since the dummy seals 130 are located in the margin area 200 to be removed after cutting, the dummy seals 130 do not remain on the display panel like the seal member 120 nor protect the display unit 110 from external moisture and oxygen. Instead, when the margin area 200 is cut and separated, one side of the margin area 200 is struck in a cutting direction and separated from the panel area 100 for smooth separation. Here, the dummy seals 130 serve as a striking point. When striking, in an embodiment, the dummy seals 130 may be struck directly, but a point even slightly outside the dummy seals 130 may be struck. The separation process including the striking will be described in further detail later below.

In an embodiment, the dummy seals 130 include a main dummy seal 131 which is a direct strike point or closest to the strike point, inner auxiliary dummy seals 132 toward the panel area 100 inside the main dummy seal 131, and outer auxiliary dummy seals 133 outside the main dummy seal 131. In an embodiment, all of the main dummy seal 131, the inner auxiliary dummy seals 132, and the outer auxiliary dummy seals 133 have a slim bar shape and are arranged at equal intervals. The number of the outer auxiliary dummy seals 133 shown is two, but the number of the outer auxiliary dummy seals 133 may be one or more. As shown in the drawings, one of the outer auxiliary dummy seals 133 adjacent to the main dummy seal 131 is arranged in the recessed zone 210 and the outer auxiliary dummy seals 133 further formed outside the recessed zone 210 may deviate from the recessed zone 210.

Figure 2:
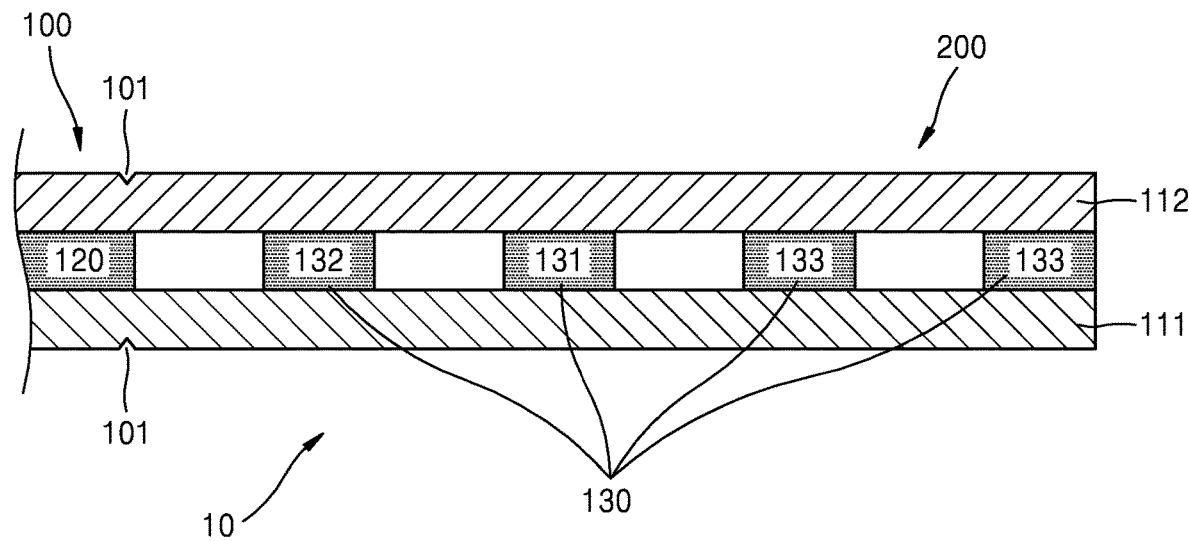
FIG. 2 is a cross-sectional view taken along the line II-II of FIG. 1.

FIG. 2 is a cross-sectional view taken along the line II-II of FIG. 1. In an embodiment, the main dummy seal 131, the inner auxiliary dummy seals 132, and the outer auxiliary dummy seals 133 are arranged at equal intervals between the base substrate 111 and the encapsulation substrate 112 such that impact applied to the main dummy seal 131 may be uniformly transmitted symmetrically inward and outward. Therefore, when the impact is struck in the vicinity of the main dummy seal 131, the impact is evenly transmitted to the inside and the outside of the main dummy seal 131, such that a cut surface is cleanly separated without being dirty as if it is jagged. An uneven area of the cut surface is referred to as a chipping area, and the chipping area may be minimized or reduced according to embodiments. A further detailed description of the chipping area will also be described later below.

Figure 3:
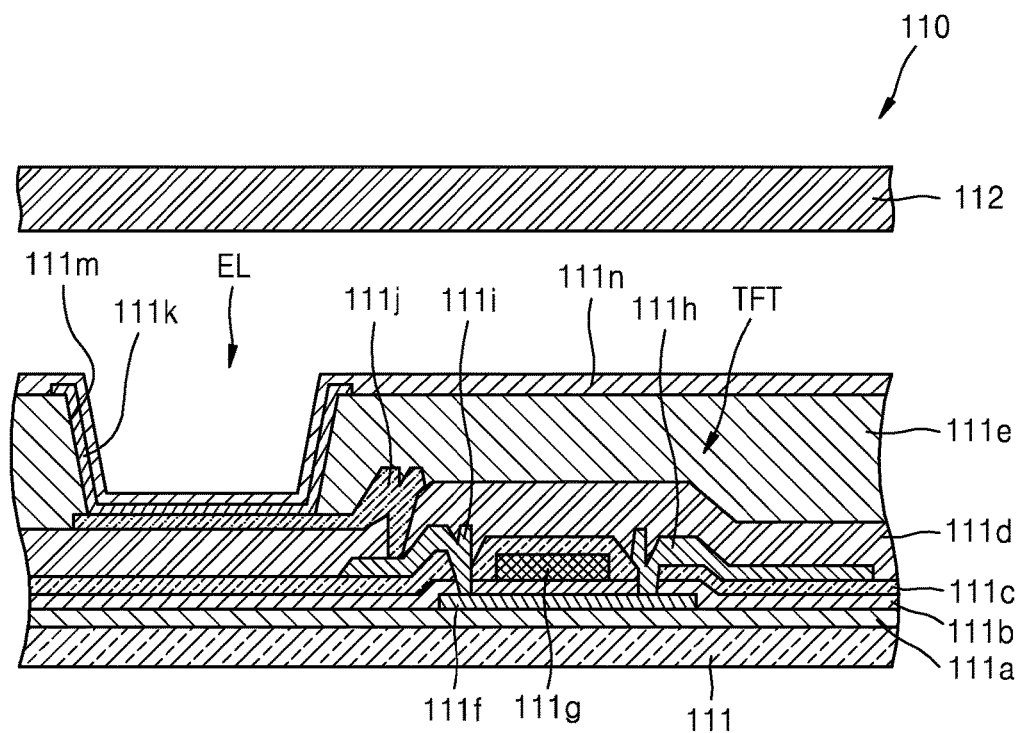
FIG. 3 is a cross-sectional view taken along the line III-III of FIG. 1.

The display unit 110 may have a cross-sectional structure as shown in FIG. 3. FIG. 3 is a cross-sectional view taken along the line III-III of FIG. 1 and illustrates a structure in which a thin-film transistor TFT and an organic light-emitting device EL are stacked on the base substrate 111. Briefly, an active layer 111$f$ is formed on a buffer layer 111$a$ on the base substrate 111. The active layer 111$f$ has source and drain regions doped with N-type or P-type impurities at high concentration. The active layer 111$f$ may include an oxide semiconductor. For example, the oxide semiconductor may include an oxide of a material selected from metal elements of Groups 12, 13, and 14, such as zinc (Zn), indium (In), gallium (Ga), tin (Sn), cadmium (Cd), germanium (Ge), and hafnium (Hf), and a combination thereof. For example, the active layer 111$f$ may include G-I-Z-O [(In$_2$O$_3$)a(Ga$_2$O$_3$)b(ZnO)c] (a, b, and c are real numbers satisfying conditions of a≥0, b≥0, and c>0, respectively). A gate electrode 111$g$ is formed on the active layer 111$f$ with a gate insulating layer 111$b$ interposed therebetween. A source electrode 111$h$ and a drain electrode 111$i$ are formed on the gate electrode 111$g$. An interlayer insulating layer 111$c$ is provided among the gate electrode 111g, the source electrode 111h, and the drain electrode 111i, and a passivation layer 111d is provided between the source electrode 111h and the drain electrode 111i and an anode electrode 111j of the organic light-emitting device EL.

An insulating planarization layer 111e is formed on the anode electrode 111j of acryl or the like, and the organic light-emitting device EL is formed after an opening (e.g., a predetermined opening) 111m is formed in the planarization layer 111e.

The organic light-emitting device EL emits red, green, and blue lights according to a current flow to display predetermined image information. The organic light-emitting device EL includes the anode electrode 111j connected to the drain electrode 111i of the thin-film transistor TFT and supplied with a positive power from the drain electrode 111i, a cathode electrode 111n that covers all pixels to supply a negative power, and a luminescent layer 111k arranged between the anode and cathode electrodes 111j and 111n to emit light.

In an embodiment, a hole injection layer (HIL), a hole transport layer (HTL), an electron transport layer (ETL), and an electron injection layer (EIL) may be stacked adjacent to the luminescent layer 111k.

For reference, the luminescent layer 111k may be formed separately for each pixel such that pixels emitting red, green, and blue lights collectively form one unit pixel. Alternatively, a luminescent layer may be formed in common over the entire pixel area regardless of locations of pixels. Here, the luminescent layer may be formed by vertically stacking or combining layers including luminescent materials that emit, for example, red, green, and blue lights. Also, light may be other color combinations, which emit white light. Furthermore, a color-conversion layer or a color filter may convert the white light that is emitted into a prescribed light color.

The luminescent layer 111k has a characteristic of being very vulnerable to moisture, and a thin-film encapsulation layer (not shown) in which an organic layer and an inorganic layer are alternately stacked may be formed over the cathode electrode 111n to further protect the luminescent layer 111k.

A cutting process of the unit panel 10 having the display unit 110 in the panel area 100 may be performed as shown in FIGS. 4A to 4E.

Figure 4A:
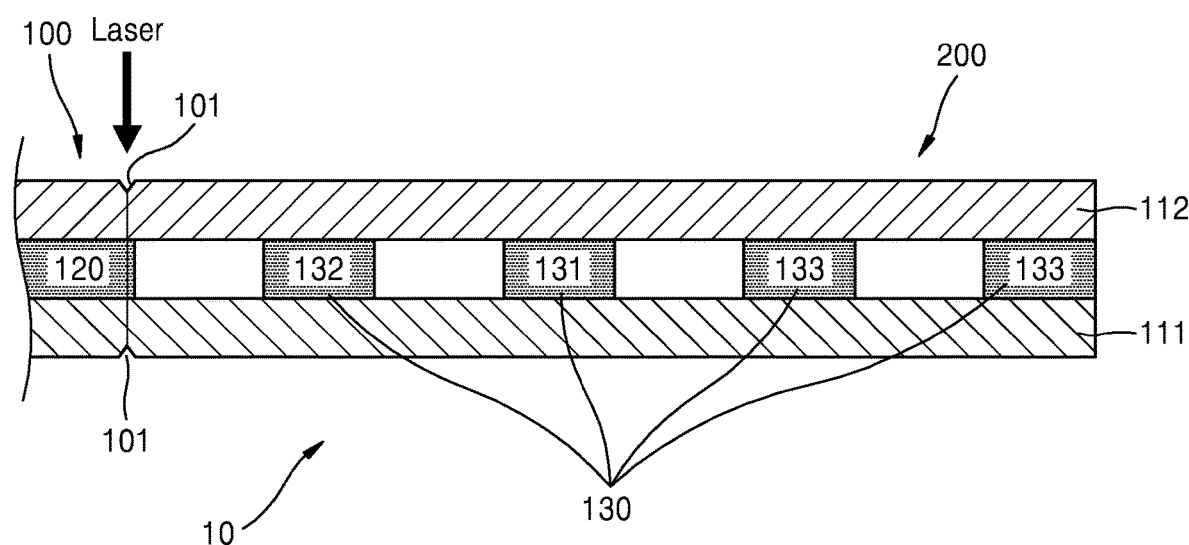
FIGS. 4A to 4E are cross-sectional views sequentially illustrating a process of cutting the unit panel of FIG. 1 along a trench.

In an embodiment, first, as shown in FIG. 4A, the unit panel 10 is prepared, and then a laser is irradiated along the trench 101 to cut the boundary between the panel area 100 and the margin area 200. Accordingly, the encapsulation substrate 112, the base substrate 111, and a portion of an outer periphery of the sealing member 120 therebetween are also cut by the laser. This laser proceeds along the trench 101 shown in FIG. 1. As the laser, a $CO_2$ laser, a green laser, an infrared laser, an ultraviolet laser, or the like may be selectively used.

Figure 4B:
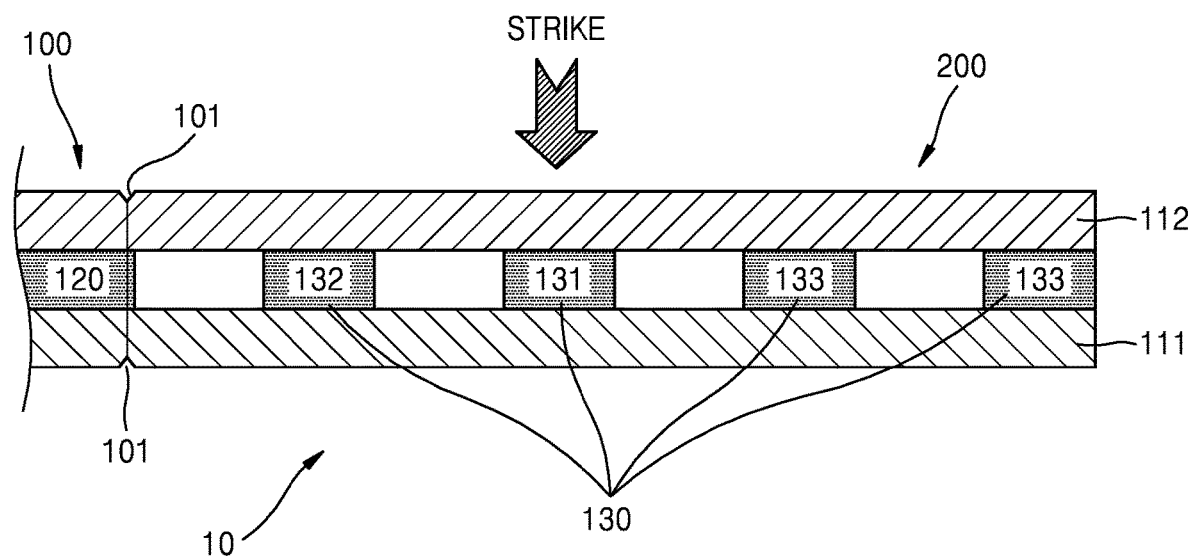
Figure 4C:
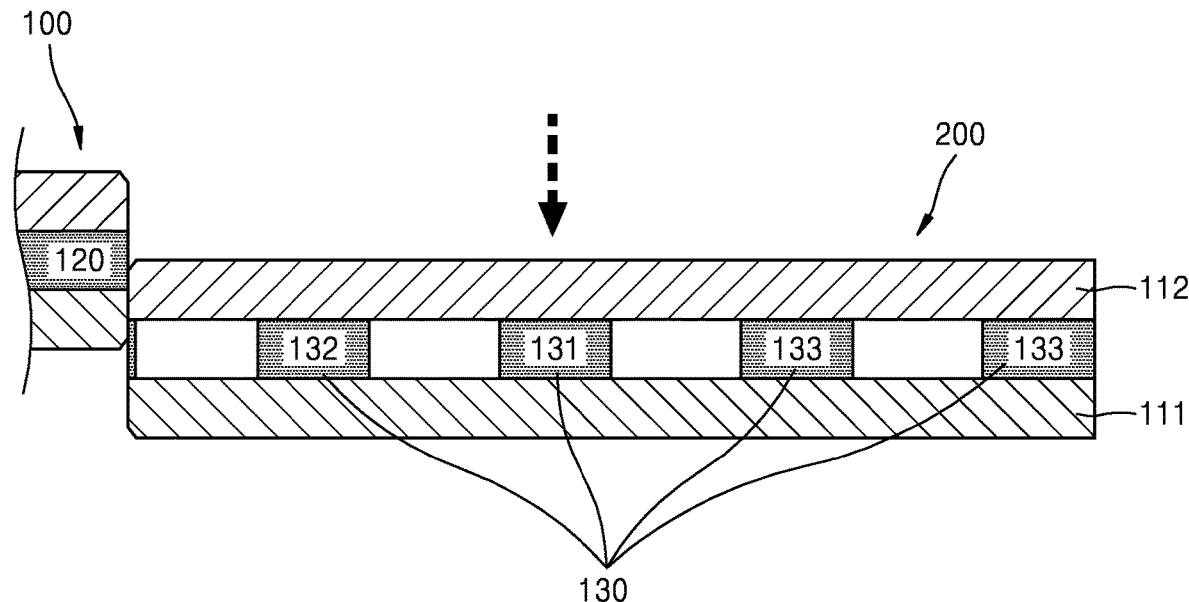
Figure 4D:
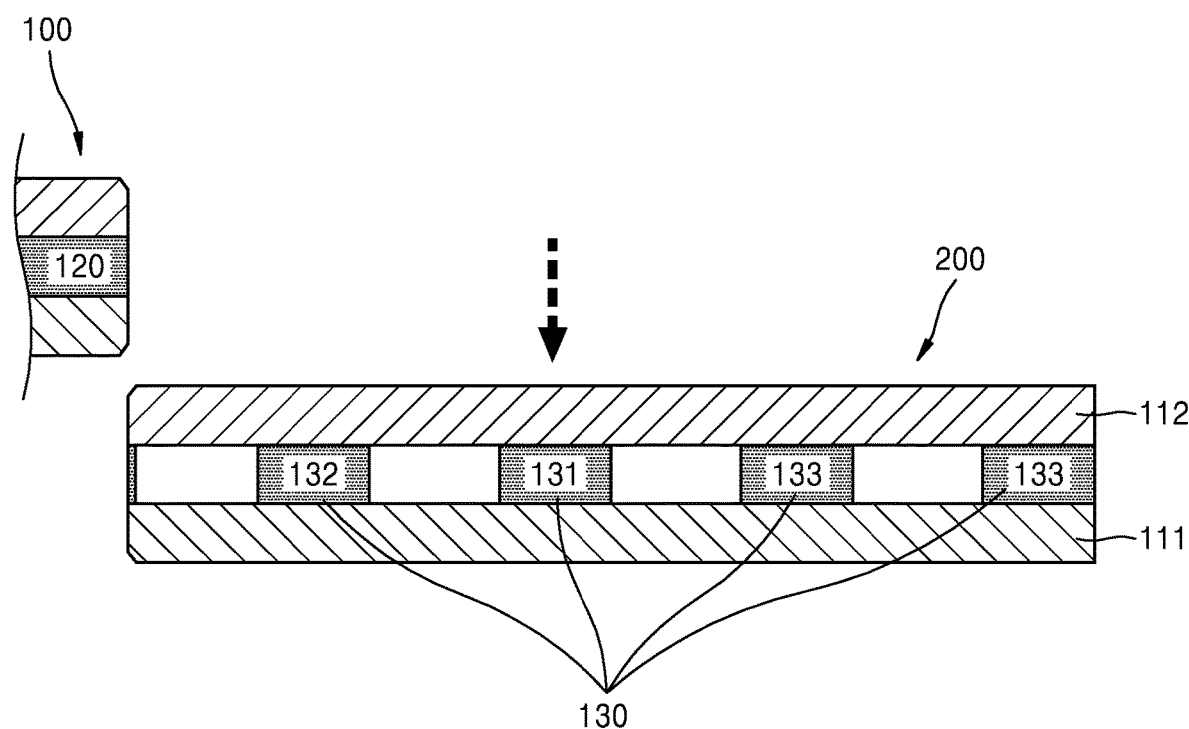

The boundary between the panel area 100 and the margin area 200 is cut off by laser cutting. However, the margin area 200 is completely removed by the next strike in order to remove only the panel area 100. In an embodiment, as shown in FIG. 4B, the vicinity of the main dummy seal 131 among the dummy seals 130 in the recessed zone 210 of the margin area 200 is struck with a striking tool (not shown). In an embodiment, the striking position is where the main dummy seal 131 is disposed, but the surface actually struck is an upper surface of the encapsulation substrate 112. As described above, in an embodiment, the main dummy seal 131 may be struck directly, but, alternatively, a separation process may be performed even if the vicinity of the main dummy seal 131 is struck. When the striking is performed in this manner, the striking may be uniform as a whole because the inner auxiliary dummy seals 132 and the outer auxiliary dummy seals 133 arranged at equal intervals support the encapsulation substrate 112 uniformly. As a result, the encapsulation substrate 112 and the base substrate 111 of the margin area 200 are concurrently (e.g., simultaneously) pushed in the striking direction as shown in FIGS. 4C and 4D, and are cleanly separated from the panel area 100. If the striking is performed without the dummy seals 130, the encapsulation substrate 112 is first struck and separated first, and the separated encapsulation substrate 112 strikes the base substrate 111 and the base substrate 111 is secondarily separated. Therefore, it is highly likely that a cut surface is dirty as it is jagged. However, in the present embodiment, the dummy seals 130 are struck and the impact may be spread uniformly, such that the entire substrate from the encapsulation substrate 112 to the base substrate 111 may be separated by being pushed once. Thus, the cut surface may be relatively cleanly formed.

Figure 4E:
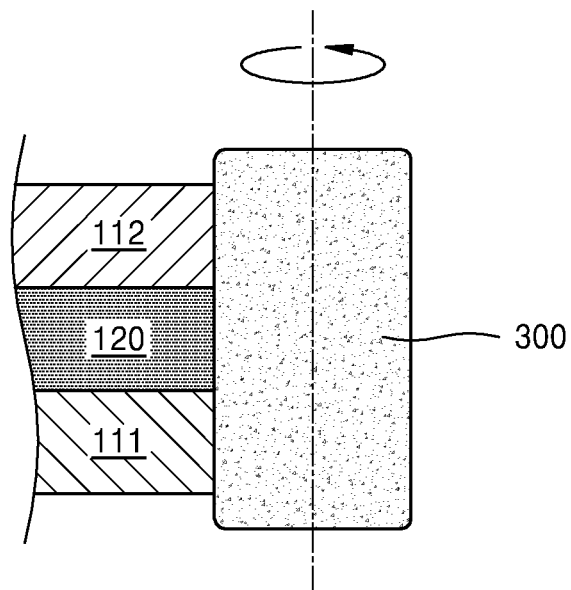

In an embodiment, after being separated by the strike, a cut surface of the panel area 100 is ground and polished by a polisher 300, as shown in FIG. 4E. Then, the panel area 100, that is, a display panel in which a cut surface is trimmed is obtained.

Figure 5:
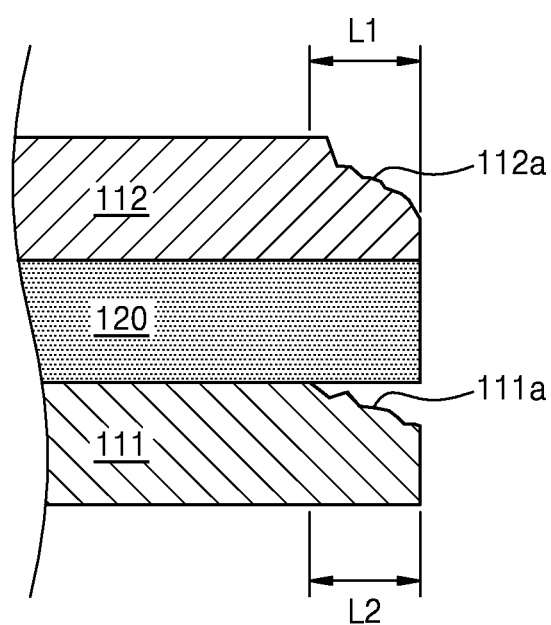
FIG. 5 is a cross-sectional view of a chipping area formed at an end portion of a panel after cutting.

According to an embodiment, as described above, an area where a cut surface is dirty, as it is jagged, is referred to as a chipping area, and the chipping area will be briefly described with reference to FIG. 5. As shown in FIG. 5, in a cross-section of the panel area 100 cut by the above-described laser-cutting and striking, there occurs an area which is not completely cut vertically, but is a slightly jagged area, which is referred to as chipping areas 111a and 112a. The chipping areas 111a and 112a are formed on sides of the base substrate 111 and the encapsulation substrate 112, respectively, in a direction in which the striking is performed. That is, the base substrate 111 is formed on a surface on which the display unit 110 is formed, and the encapsulation substrate 112 is formed on an outer surface opposite a surface facing the display unit 110. However, the problem is lengths L1 and L2 of the chipping areas 111a and 112a. When the lengths L1 and L2 are long, an end portion of a display panel becomes dirty, and it may appear to be jagged even with the naked eye, resulting in product failure. However, when these lengths L1 and L2 are short, there is no defect in a product.

In an embodiment, when the dummy seals 130 are arranged by the method of the present embodiment and a separating operation is performed by laser cutting and striking, the lengths L1 and L2 of the chipping areas 111a and 112a are 200 μm or less, such that the product may have no defect. In an embodiment, a difference between the length L1 of the chipping region 112a of the encapsulation substrate 112 and the length L2 of the chipping region 111a of the base substrate 111 is also 10 μm or less, such that an imbalance phenomenon in which one of the substrates becomes more jagged is hardly generated.

Therefore, according to the present embodiment described above, it is possible to reduce the possibility of the occurrence of a dirty chipping area on a cut surface of a display panel, thereby reducing the occurrence of defects in a product, and an operation may be performed in a highly stable manner. Accordingly, both production efficiency and product quality may be improved.

Figure 6A:
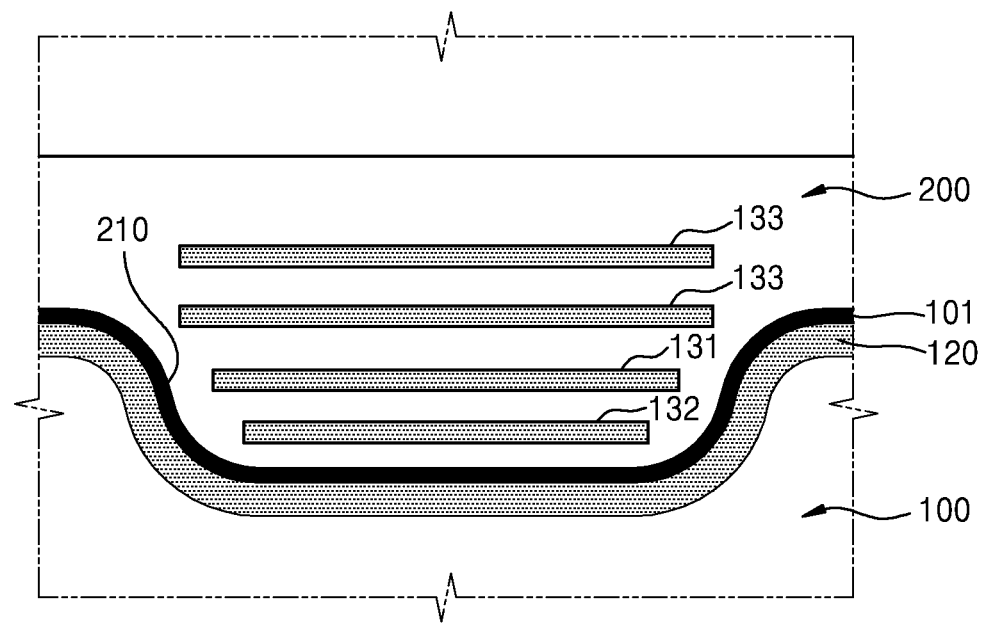
FIGS. 6A to 6D are plan views illustrating various examples of dummy seals shown in FIG. 1.

As shown in an enlarged view in FIG. 6A, all of the main dummy seal 131, the inner auxiliary dummy seals 132, and the outer auxiliary dummy seals 133 are formed in a slim bar shape in the above-described embodiment, but these shapes may be varied in embodiments.

Figure 6B:
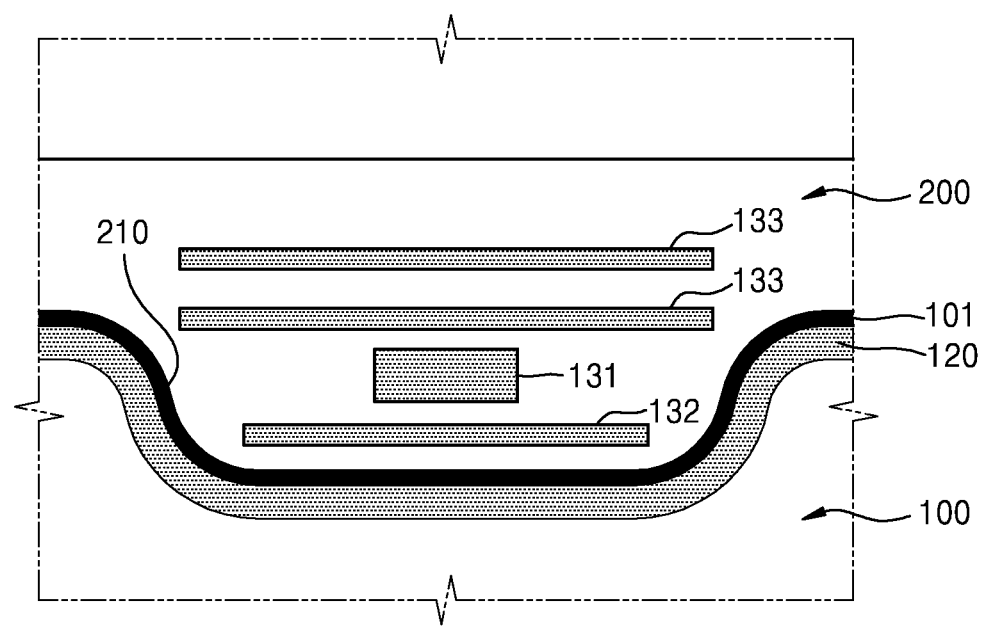

For example, in an embodiment, as shown in FIG. 6B, the inner auxiliary dummy seals 132 and the outer auxiliary dummy seals 133 may have a slim bar shape, and the main dummy seal 131 may have a box shape.

Figure 6C:
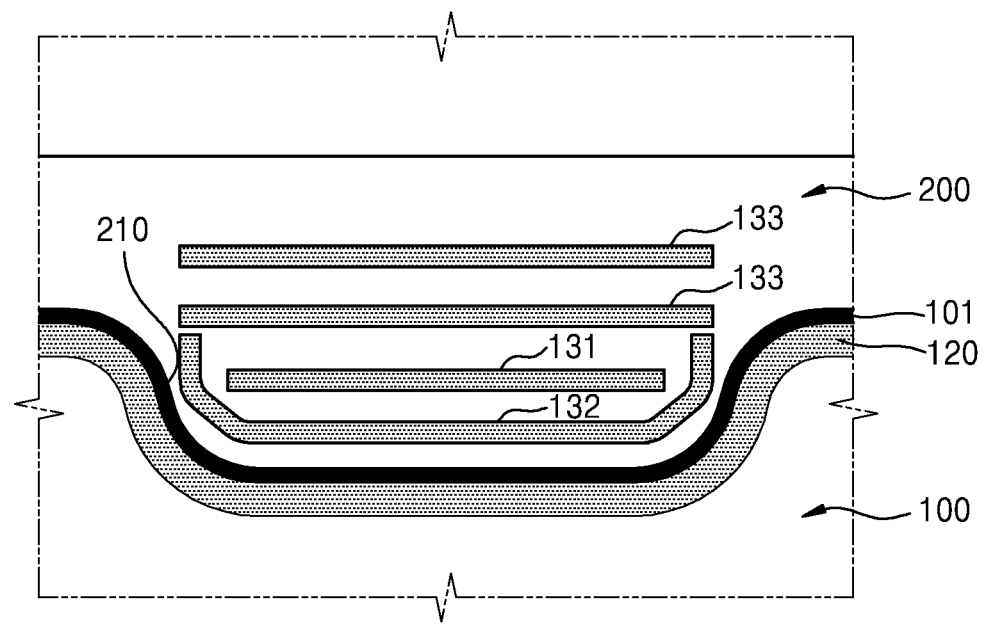

Alternatively, as shown in FIG. 6C, the main dummy seal 131 and the outer auxiliary dummy seals 133 may have a slim bar shape, and the inner auxiliary dummy seals 132 may have a U-shape surrounding the main dummy seal 131.

Figure 6D:
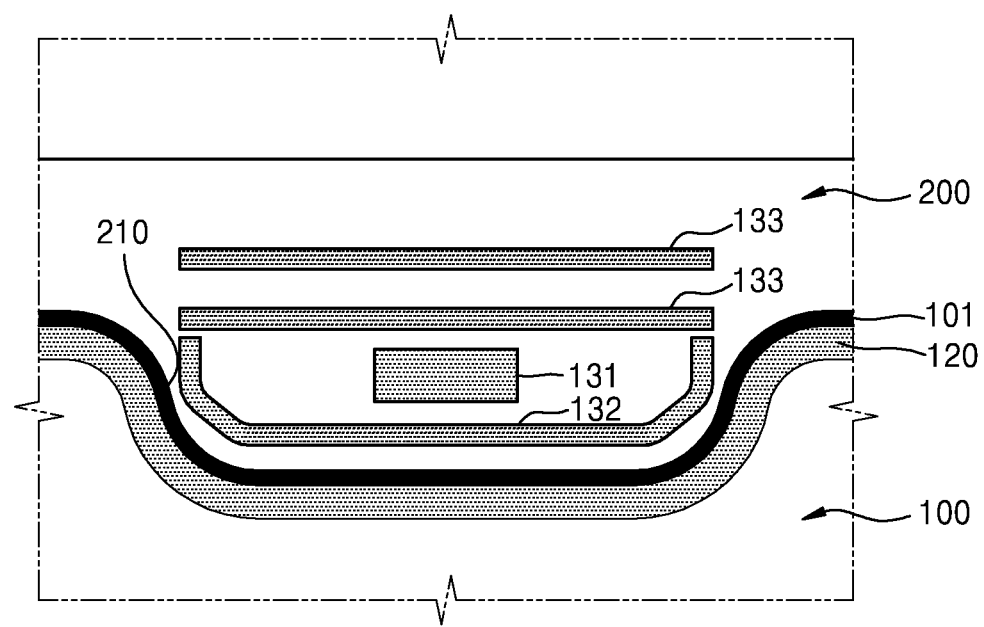

Alternatively, as shown in FIG. 6D, the main dummy seal 131 may have a box shape, the outer auxiliary dummy seals 133 may have a slim bar shape, and the inner auxiliary dummy seals 132 may have a U-shape surrounding the main dummy seal 131.

Therefore, it is to be understood that shapes of components of the dummy seals 130 may be varied.

It is to be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as set forth by the following claims.

What is claimed is:

1. A method of manufacturing a display panel, the method comprising:
    preparing a unit panel including a panel area having a display unit and a margin area arranged outside the panel area and including one or more dummy seals;
    cutting a line between the panel area and the margin area by irradiating a laser along a boundary of the panel area; and
    striking a vicinity of the one or more dummy seals such that the margin area at an outer periphery of the cut line is separated from the panel area,
    wherein the unit panel is provided with a recessed zone in which a boundary between the panel area and the margin area is recessed toward the display unit, and
    the one or more dummy seals are in the recessed zone.

2. A method of manufacturing a display panel, the method comprising:
    preparing a unit panel including a panel area having a display unit and a margin area arranged outside the panel area and including one or more dummy seals;
    cutting a line between the panel area and the margin area by irradiating a laser along a boundary of the panel area; and
    striking a vicinity of the one or more dummy seals such that the margin area at an outer periphery of the cut line is separated from the panel area,
    wherein the unit panel includes a base substrate, the display unit provided on the base substrate, an encapsulation substrate covering the display unit, a sealing member surrounding the display unit and filling a gap between the base substrate and the encapsulation substrate, and
    an inner side of an area surrounded by the sealing member is the panel area, and an outer side of the area is the margin area,
    wherein the one or more dummy seals include a main dummy seal closest to a position that is struck and auxiliary dummy seals spaced apart from the main dummy seal,
    wherein the auxiliary dummy seals include one or more inner auxiliary dummy seals arranged between the main dummy seal and the panel area, and one or more outer auxiliary dummy seals arranged at an outer periphery of the main dummy seal, and
    wherein the main dummy seal has a slim bar shape or a box shape, the one or more outer auxiliary dummy seals have a slim bar shape, and an inner auxiliary dummy seal of the one or more inner auxiliary dummy seals has a U-shape surrounding sides of the main dummy seal.

3. The method of claim 2, wherein the main dummy seal has a box shape.

* * * * *